United States Patent
Wu

(10) Patent No.: US 8,751,554 B2
(45) Date of Patent: Jun. 10, 2014

(54) SYSTEMS AND METHODS FOR AN ADJUSTABLE FILTER ENGINE

(75) Inventor: Chihsin Wu, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 950 days.

(21) Appl. No.: 12/767,405

(22) Filed: Apr. 26, 2010

(65) Prior Publication Data
US 2011/0264722 A1 Oct. 27, 2011

(51) Int. Cl.
*G06F 17/10* (2006.01)
(52) U.S. Cl.
USPC .......................................... 708/322
(58) Field of Classification Search
CPC .......... H03H 21/0012; H03H 17/0294; H03H 21/0043; H04B 3/23; H04L 25/03043; H04L 2025/0351; H03G 5/005
USPC ................................ 708/322–323
See application file for complete search history.

(56) References Cited

U.S. PATENT DOCUMENTS

2009/0094304 A1* 4/2009 Batruni ..................... 708/304

* cited by examiner

*Primary Examiner* — Tan V. Mai
(74) *Attorney, Agent, or Firm* — Kramer Levin Naftalis & Frankel LLP

(57) ABSTRACT

Systems and methods are provided for an adjustable filter engine. In particular, an electronic system is provided that can include a focus module, memory, and control circuitry. In some embodiments, the focus module can include an adjustable filter engine and a motor. By using the adjustable filter engine to generate a filter with a large number of filter coefficients, the control circuitry can accommodate a variety of system characteristics. For example, by generating a set of cumulative coefficients and re-arranging the order of the cumulative coefficients, the control circuitry can reduce the bit-width requirements of the adjustable filter engine hardware. For instance, the control circuitry can reduce the number of multipliers required to perform a convolution between an updated filter and one or more input signals. In some embodiments, the updated filter can be generated to reduce oscillations of the motor movement due to a new position request.

21 Claims, 6 Drawing Sheets

SYSTEMS AND METHODS FOR AN ADJUSTABLE FILTER ENGINE

FIELD OF THE INVENTION

This is directed to systems and methods for an adjustable filter engine.

BACKGROUND OF THE INVENTION

Digital filters can be found in a wide variety of applications. Infinite impulse response ("IIR") filters can provide adequate filter responses with a small number of filter coefficients. Unfortunately, IIR filters are prone to numerical instability, and a system that uses IIR filters may have difficulty satisfying linear phase requirements.

In contrast, finite impulse response ("FIR") filters can provide better control in terms of numerical stability, and a system that uses FIR filters can more easily achieve linear phase requirements. However, such a system may need to use a larger number of filter coefficients before the FIR filter can achieve responses comparable to responses that can be provided by an IIR filter. As a result, the system may need to use a large number of hardware logic and silicon real estate in order to support a large number of filter coefficients.

DETAILED DESCRIPTION OF THE INVENTION

Discussed herein are systems and methods for an adjustable filter engine. For some systems, the input change rate of a component can be significantly slower than the sampling frequency. In addition, the system clock rate can be higher than or equal to the sampling frequency. For such a system, a FIR filter with a large number of filter coefficients can be used.

For example, an electronic system, such an imaging system (e.g., a still camera or a video camera), may include a focus module that may require a component position change (e.g., a lens position change) only once per frame. For instance, in some cases, the resonance frequency of the focus module (e.g., 180 Hz) can be approximately one order of magnitude greater than the frame rate (e.g., 30 frames per second). In addition, the system clock rate of the focus module (e.g., 120 kHz) can be higher than or equal to the sampling frequency (e.g., 40 kHz).

Persons skilled in the art will appreciate that although this discussion is associated with an imaging system, an adjustable filter engine can be used for any suitable system that satisfies the system requirements. That is, the adjustable filter engine can be used for any suitable system where the component change rate is slower than the sampling frequency, and the system clock rate is higher than or equal to the sampling frequency.

Figure 1:
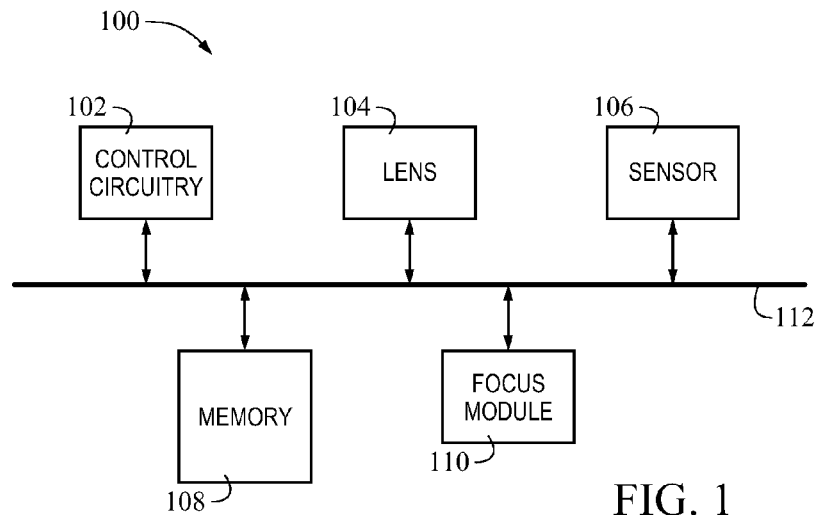
FIG. 1 is a schematic view of an illustrative electronic system in accordance with embodiments of the invention.

FIG. 1 is a schematic view of an illustrative electronic system 100 in accordance with embodiments of the invention. Electronic system 100 can include control circuitry 102, lens 104, sensor 106, memory 108, and focus module 110. In some embodiments, electronic system 100 can be a non-mobile imaging system or device, such as, for example, a desktop computer camera or medical imaging equipment. In other embodiments, electronic system 100 can a mobile imaging system or device such as, for example, a portable still camera, a portable video camera, or a camera phone. Persons skilled in the art will appreciate that electronic system 100 can include any other components in a typical camera (or otherwise) not shown in FIG. 1. Persons skilled in the art will also appreciate that electronic system 100 can be any other system where the component change rate of a component can be significantly slower than the sampling frequency and where the system clock rate can be higher than or equal to the sampling frequency.

Control circuitry 102 may include any circuitry capable of controlling camera operations and image focus. Control circuitry 102 may also be capable of performing any suitable operation on an image, such as, for example, automatic exposure, color balancing, and focus recovery. In addition, control circuitry 102 may be capable of communicating with other components of electronic system 100 (e.g., lens 104, sensor 106, memory 108, and/or focus module 110) over a bus 112. Control circuitry 102 may include, for example, one or more processors, digital signal processors, microprocessors, ASICS, FPGAs, or any suitable combination of hardware and software.

Lens 104 can include any suitable type of lens for focusing an image such as, for example, an extended depth of field ("EDOF") lens or a fisheye lens. In some embodiments, electronic system 100 can capture an image by first passing the image through lens 104.

Sensor 106 can include any suitable image capturing technology such as, for example, a complementary metal-oxide semiconductor ("CMOS") imager or a charge-coupled device ("CCD") imager. Sensor 106 can be implemented using any suitable combination of hardware and software. For example, sensor 106 can be implemented substantially all in hardware as a system-on-a-chip ("SoC"). This way, sensor 106 can have a small design with minimized area and circuit components designed to maximize the speed of operation.

In some embodiments, sensor 106 can sample an image after the image has passed through lens 104. After sampling the image, sensor 106 can produce an electric charge at each pixel in the image. Sensor 106 can then quantize the electric charge at each pixel to produce an output image.

Memory 108 can include any suitable combination of non-volatile and volatile memories, such as cache memory, Flash memory, random access memory ("RAM") (e.g., DDR RAM and/or static random access memory ("SRAM")), read only memory ("ROM"), removable memory, or any combination thereof. Memory 108 may be on a different chip than control circuitry 102 or may be combined with control circuitry 102 on a single integrated circuit.

Memory 108 can include one or more memory modules operative to provide mass storage for control circuitry 102. For example, memory 108 can be used by control circuitry 102 to store images captured by electronic system 100 and any other information related to the captured images. As another example, memory 108 can include a multiple-entry, multiple-bit SRAM (e.g., a 256-entry 5-bit SRAM) that can store any suitable type of data (e.g., one or more filter coefficients). As yet another example, memory 108 can include one or more registers for storing data. The data can include any suitable data such as, for example, data for accessing a SRAM, data corresponding to a current position of a motor, data corresponding to a next position of a motor, and/or any other suitable type of data.

Focus module 110 can include one or more components for focusing one or more portions of an image. For example, a user of a camera may desire to focus an image at a particular position or area. Based on inputs from sensor 106, focus module 110 can adjust the focus of the image by changing the position of lens 104. In some embodiments, focus module 110 can be an autofocus ("AF") module that can automatically determine a correct focus for an image based on data generated by sensor 106.

Figure 2:
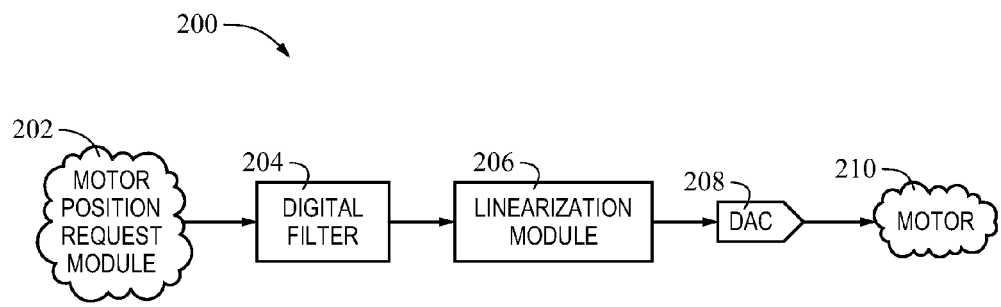
FIG. 2 is a schematic view of an illustrative focus module of an electronic system in accordance with embodiments of the invention.

FIG. 2 is a schematic view of an illustrative focus module 200 of an electronic system 100 in accordance with embodiments of the invention. Focus module 200 can be a module that is the same as or similar to focus module 110 (FIG. 1). Focus module 200 can include motor position request module 202, digital filter 204, linearization module 206, digital-to-analog converter ("DAC") 208, and motor 210. In some embodiments, the electronic system can activate focus module 200 when an electronic system is operating in a half-button mode. The half-button mode may be initiated when a user selects to focus an image by depressing a button half-way on an electronic system (e.g., a camera).

Upon activation of focus module 200, motor position request module 202 can generate a digital code corresponding to a next position of motor 210 (e.g., based on inputs from sensor 106 of FIG. 1). Control circuitry (e.g., control circuitry 102 of FIG. 1) can then pass the digital code to digital filter 204. Digital filter 204 can be any suitable low-pass digital filter such as, for example, a FIR or IIR filter. Digital filter 204 can be used to reduce oscillations (e.g., ringing, rippling, and/or underdamping) and/or reduce settling time (e.g., overdamping) in the movements of motor 210 as a next position request is applied to motor 210. Digital filter 204 will be discussed in more detail in connection with FIGS. 3-6.

After processing the next position using digital filter 204, the control circuitry can pass the output of digital filter 204 to linearization module 206. In response to receiving the output of digital filter 204, linearization module 206 can generate one or more digital values, which may compensate for non-linearity in the displacement-voltage curve of motor 210. By linearizing the displacement-voltage curve of motor 210, a unit increase in the voltage applied to motor 210 can produce a linear increase in the movement or displacement of motor 210. This linearization thus allows focus module 200 to operate in the linear domain.

The one or more digital values generated by linearization module 206 can then be used to drive DAC 208 (e.g., a 10-bit DAC). DAC 208 can convert the one or more digital values into a particular voltage, which in turn can drive the movements of motor 210. In some embodiments, DAC 208 can drive the movements of motor 210 in μm accuracy.

Persons skilled in the art will appreciate that motor 210 can be any suitable motor that can be used to change the position of a lens (e.g., lens 104 of FIG. 1) in the electronic system. For example, motor 210 can be any suitable electromechanical actuator such as a micro-electro-mechanical systems ("MEMS") actuator.

In some cases, different motors or actuators may have different tolerances in response to new position requests. For example, as compared to other actuators some actuators may require a longer time in order to settle into a new position in response to a new position request (e.g., a longer settling time). Digital filter 204 can thus be designed to compensate for the different tolerances of a variety of motors.

Figure 3:
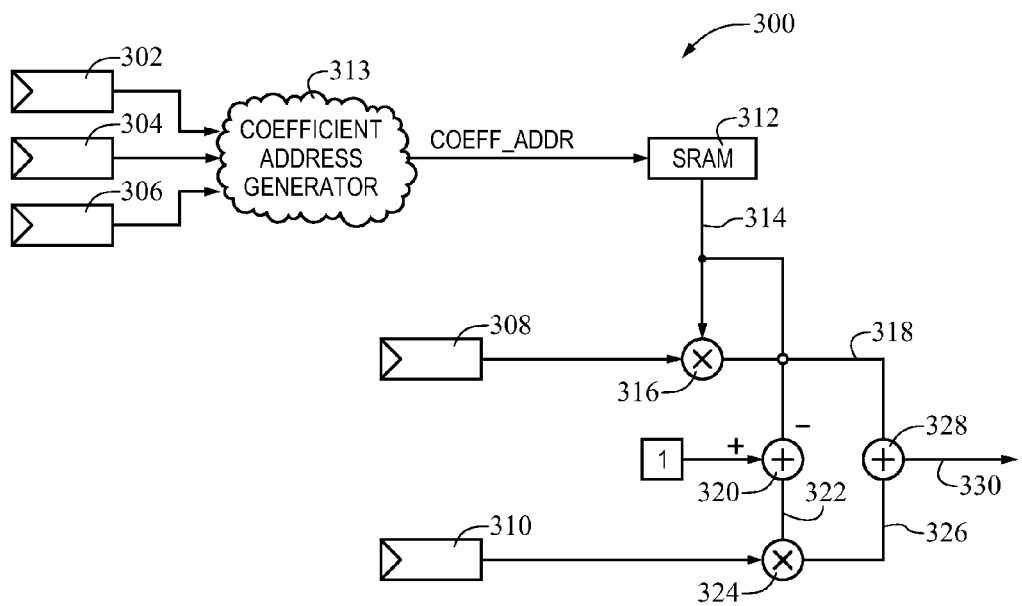
FIG. 3 is a schematic view of an illustrative adjustable filter engine in accordance with embodiments of the invention.
Figure 4:
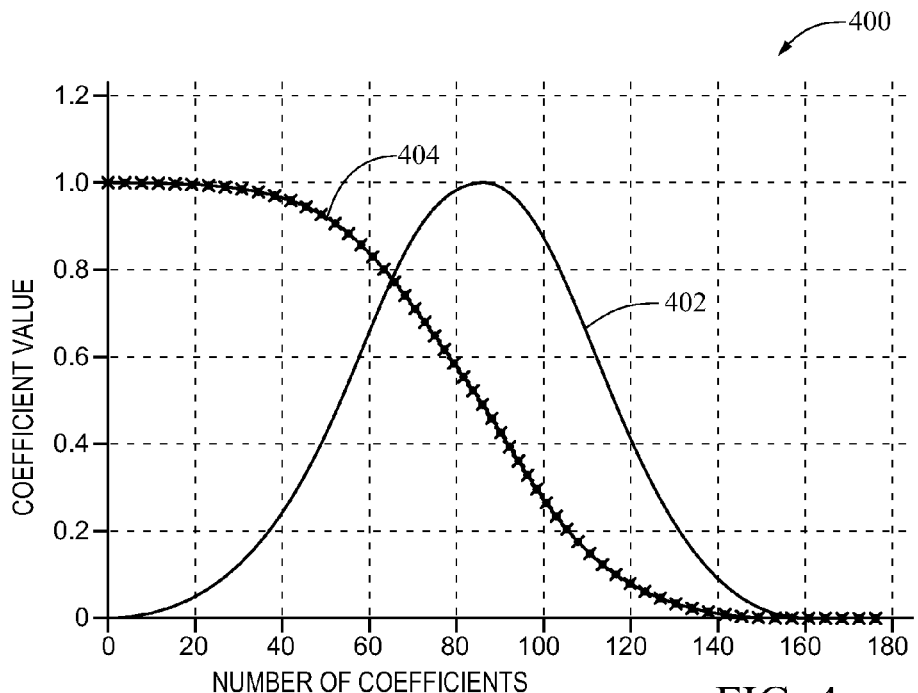
FIG. 4 is a graph of illustrative filter coefficients and cumulative coefficients in accordance with embodiments of the invention.

FIG. 3 will be described with continued references to graph 400 of FIG. 4, SRAM 500 of FIG. 5, and graphs 600, 602, and 604 of FIGS. 6A-6C, respectively. FIG. 3 is a schematic view of an illustrative adjustable filter engine 300 in accordance with embodiments of the invention. In some embodiments, adjustable filter engine 300 can be implemented as a part of a digital filter (e.g., digital filter 204 of FIG. 2) of an electronic system (e.g., electronic system 100 of FIG. 1).

Control circuitry (e.g., control circuitry 102 of FIG. 1) of the electronic system can use adjustable filter engine 300 to program various data in registers 302-310 and SRAM 312. Registers 302-310 and SRAM 312 can be included in any suitable component of the electronic system. For example, registers 302-310 and SRAM 312 can be included in memory 108 of FIG. 1. As another example, registers 302-310 and SRAM 312 can be included in adjustable filter engine 300.

In some embodiments, using the digital filter, the control circuitry can generate a set of filter coefficients corresponding to a FIR filter (e.g., a low-pass FIR filter). For example, FIG. 4 shows graph 400 of illustrative filter coefficients. Graph 400 can include a set of filter coefficients 402 (which has been scaled to have a maximum value of 1 for enhanced viewing) corresponding to a low-pass FIR filter.

A set of filter coefficients for a FIR filter can be described by:

$$c = \{c_o, c_1, \ldots, c_{N-1}\} \quad (1),$$

where c corresponds to the set of filter coefficients and N is the number of coefficients of the FIR filter. For example, as shown in FIG. 4, the number of coefficients of the FIR filter can be 181. In some embodiments, the set of filter coefficients 402 can be normalized.

Referring back to FIG. 3, based on a set of filter coefficients of a FIR filter, the control circuitry of the electronic system can generate a set of cumulative coefficients, where each cumulative coefficient can correspond to an accumulation of one or more filter coefficients. Thus, the control circuitry generates a set of cumulative coefficients according to:

$$C = \left\{ C_i \mid C_i = \sum_{k=0}^{N-1-i} c_k, i \in \{1, \ldots, N-1\} \right\}, \quad (3)$$

where C corresponds to the set of cumulative coefficients, and N−1 corresponds to the number of cumulative coefficients.

After generating the cumulative coefficients, the control circuitry can re-arrange the ordering of the set of cumulative coefficients by reversing the ordering of the set of cumulative coefficients. By re-arranging the ordering of the set of cumulative coefficients in such a way, additional hardware (e.g., one or more accumulators) can be omitted from adjustable filter engine 300. For example, graph 400 of FIG. 4 includes a set of cumulative coefficients 404, in which the ordering of a set of cumulative coefficients has been reversed. In addition, as shown in FIG. 4, the number of cumulative coefficients can be 180. Persons skilled in the art will appreciate that the number of coefficients of the FIR filter and the number of cumulative coefficients provided in graph 400 are merely illustrative. Therefore, the number of coefficients and the corresponding number of cumulative coefficients can be any suitable number.

Referring back to FIG. 3, after generating the set of cumulative coefficients, the control circuitry can program the set of cumulative coefficients in SRAM 312. For example, the control circuitry can first determine one or more parameters associated with the set of cumulative coefficients. After determining the one or more parameters, the control circuitry can program the one or more parameters in one or more registers (e.g., registers 302-306) of the memory (e.g., memory 108 of FIG. 1). The one or more programmed parameters can then be used to program the set of cumulative coefficients in SRAM 312.

For example, the control circuitry can determine a start address of SRAM 312 in which to begin to store the set of cumulative coefficients. As another example, the control circuitry can determine the number of cumulative coefficients to program in SRAM 312. The number of cumulative coefficients may the same as or smaller than the number of entries in SRAM 312. For instance, if SRAM 312 includes 256 entries and the number of cumulative coefficients is 180, the control circuitry may not fill every entry of SRAM 312 with cumulative coefficients. As yet another example, the control circuitry can determine a step size for programming the set of cumulative coefficients. For instance, a step size of 1 can correspond to programming one cumulative coefficient into every entry of SRAM 312 from the start address of SRAM 312 until all of the cumulative coefficients have been programmed. Similarly, a step size of 2 can correspond to programming one cumulative coefficient into every other entry of SRAM 312.

After determining the one or more parameters, the control circuitry can program the one or more parameters in one or more registers of the memory. For example, Table 1 shows one or more programmable registers that can be provided by the memory.

TABLE 1

| Register Name |
| --- |
| enable |
| start_addr |
| num_coeff |
| step_size |
| sample_period_coeff |

For example, as shown in Table 1, the memory can include an enable register. In some cases, when the enable register is set to a particular value, the control circuitry can enable a digital filter (e.g., digital filter 204). As another example, the memory can include a start_addr register (e.g., register 302) that can correspond to a start address of SRAM 312 in which to begin to program the set of cumulative coefficients. As yet another example, the memory can include a num_coeff register (e.g., register 304) that can correspond to a total number of cumulative coefficients to program in SRAM 312. As a further example, the memory can include a step_size register (e.g., register 306) that can correspond to a step size for programming the set of cumulative coefficients. Thus, for the set of cumulative coefficients 404 of FIG. 4, the control circuitry can program 1, 0, 180, and 1 into enable, start_addr, num_coeff, and step_size registers, respectively. Persons skilled in the art will appreciate that the registers listed in Table 1 are merely illustrative. Thus, the memory can include registers additional to or instead of the registers listed in Table 1. For example, the memory can include one or more registers for reading or writing addresses to SRAM 312, one or more registers for reading or writing data to SRAM 312, one or more registers for specifying a sampling period of the set of cumulative coefficients, one or more registers for specifying a current position of a motor and a next position of the motor, any other suitable registers, and/or any combination thereof.

After programming the one or more parameters in one or more registers of the memory, the control circuitry can use coefficient address generator 313 to generate one or more coefficient addresses for programming SRAM 312. For example, based on parameters programmed in one or more registers (e.g., registers 302-306), coefficient address generator 313 can determine one or more coefficient addresses (e.g., coefficient addresses corresponding to one or more entries of SRAM 312) for programming the set of cumulative coefficients. In response to receiving the one or more coefficient addresses, the control circuitry can program the set of cumulative coefficients in SRAM 312.

Figure 5:
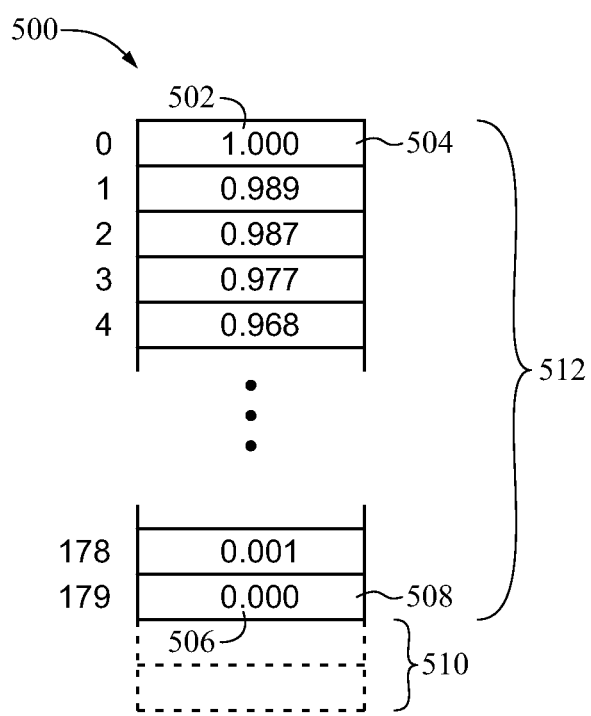
FIG. 5 is a schematic view of illustrative entries of a static random access memory ("SRAM") programmed in accordance with embodiments of the invention.

For example, FIG. 5 is a schematic view of illustrative entries of SRAM 500. In some embodiments, SRAM 500 can be the same as or similar to SRAM 312 of FIG. 3. If the parameters 1, 0, 180, and 1 are programmed into the enable, start_addr, num_coeff, and step_size registers, respectively, the control circuitry can use the coefficient addresses generated by a coefficient address generator (e.g., coefficient address generator 313 of FIG. 3) to program SRAM 500. For example, the control circuitry can program the first cumulative coefficient of the set of cumulative coefficients (e.g., cumulative coefficient 502) in entry 504 of SRAM 500. The control circuitry can then continue to program a cumulative coefficient for consecutive entries of SRAM 500 until the last cumulative coefficient of the set of cumulative coefficients (e.g., cumulative coefficient 506) has been programmed into entry 508 of SRAM 500. In contrast, if the parameter programmed into the step_size register is 2, the control circuitry can program a cumulative coefficient into every other entry of SRAM 500. Furthermore, as shown in FIG. 5, SRAM 500 may include additional entries 510 that may not have any cumulative coefficients. Persons skilled in the art will appreciate that the values of the cumulative coefficients shown in SRAM 500 are merely illustrative.

Referring back to FIG. 3, after programming the set of cumulative coefficients in SRAM 312, the control circuitry can generate an updated filter in order to accommodate one or more system characteristics of a focus module (e.g., focus module 110 of FIG. 1 and/or focus module 200 of FIG. 2). The system characteristics can include, for example, one or more characteristics of a motor (e.g., motor 210 of FIG. 2), a system clock rate, a sampling rate of a FIR filter, a preferred number of cumulative coefficients to use for the updated filter, any other suitable system characteristics, and/or any combination thereof.

In some embodiments, the system characteristics can correspond to the characteristics of a motor in response to a position change. For example, in order to move a motor from a current position to a next position, a motor position request module (e.g., motor position request module 202 of FIG. 2) may issue a new position request to the motor. As the motor moves from a current position to a next position, however, the new position request may cause oscillations in the motor movement. Thus, the control circuitry can determine a step response of the updated filter, which can be used to compensate for oscillations in the motor movement due to the new position request. The step response of the updated filter can be associated with, for example, a preferred settling time.

The updated filter can be generated using any suitable approach. In some embodiments, the control circuitry can adjust one or more parameters associated with the set of cumulative coefficients. For example, based on a preferred settling time and a preferred number of cumulative coefficients, the control circuitry can determine a sampling rate of a FIR filter. The control circuitry can, for instance, determine a sampling rate of a FIR filter according to:

$$filter\_sample\_rate = settling\_time / pref\_num\_coeff \quad (4),$$

where filter_sample_rate is the sampling rate of the FIR filter, settling_time is the preferred settling time, and pref_num_coeff is the preferred number of cumulative coefficients. For example, for a preferred settling time of 4.525 ms and a preferred number of cumulative coefficients of 180, the control circuitry can determine that the sampling rate of the FIR filter is 25 µs (e.g., sampling frequency of 40 kHz).

Based on the sampling rate of the FIR filter and a system clock rate, the control circuitry can determine a sampling period of the set of cumulative coefficients. The control circuitry can, for instance, determine a sampling period of the set of cumulative coefficients according to:

$$sample\_period\_coeff = clk\_rate * filter\_sample\_rate \quad (5),$$

where sample_period_coeff is the sampling period of the set of cumulative coefficients and clk_rate is the system clock rate. For example, for a system clock rate of 120 kHz and a sampling rate of the FIR filter of 25 µs, the control circuitry can determine that the sampling period of the set of cumulative coefficients is 3. Persons skilled in the art will appreciate that this example is merely illustrative, and the control circuitry can determine the sampling period of the set of cumulative coefficients based on any suitable system characteristic. Thus, the control circuitry can adjust the sampling period of the set of cumulative coefficients based on any settling time, any number of cumulative coefficients, and/or any sampling rate of the FIR filter.

After determining the sampling period of the set of cumulative coefficients, the control circuitry can program the sampling period into a sample_period_coeff register (Table 1) of the memory. In addition, the control circuitry can program the enable, start_addr, num_coeff, and step_size registers of the memory, respectively. For example, the control circuitry can program the values of 3, 1, 0, 180, and 1 into the sample_period_coeff, enable, start_addr, num_coeff, and step_size registers, respectively.

In response to adjusting and programming the one or more parameters into the memory, the control circuitry can generate an updated filter by accessing one or more cumulative coefficients 314 from SRAM 312 (e.g., reading one or more cumulative coefficients 314 from SRAM 312). For example, based on the values programmed in one or more registers (e.g., sample_period_coeff, enable, start_addr, num_coeff, and/or step_size registers), coefficient address generator 313 can determine one or more coefficient addresses for accessing one or more entries of SRAM 312. For instance, based on parameters programmed in registers 302-306, coefficient address generator 313 can generate one or more coefficient addresses corresponding to one or more cumulative coefficients 314.

Based on the one or more coefficient addresses, the control circuitry can read one or more cumulative coefficients 314 at a sampling rate of a FIR filter (e.g., 25 µs) to produce an updated filter. As a result, the updated filter can have filter characteristics that can compensate for oscillations in the motor movement. In some embodiments, the updated filter can be a low-pass filter.

Figure 6A:
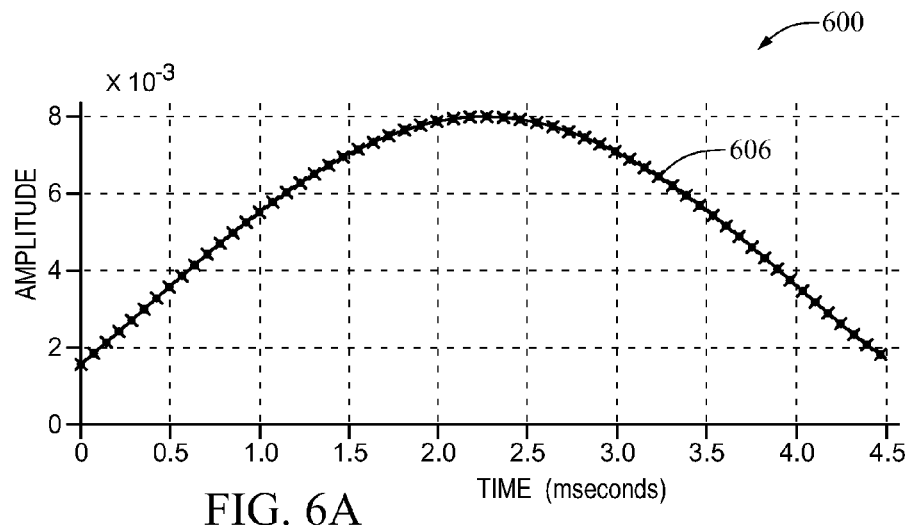
FIGS. 6A-6C are graphs of various filter responses of an illustrative filter generated using cumulative coefficients in accordance with embodiments of the invention.
Figure 6B:
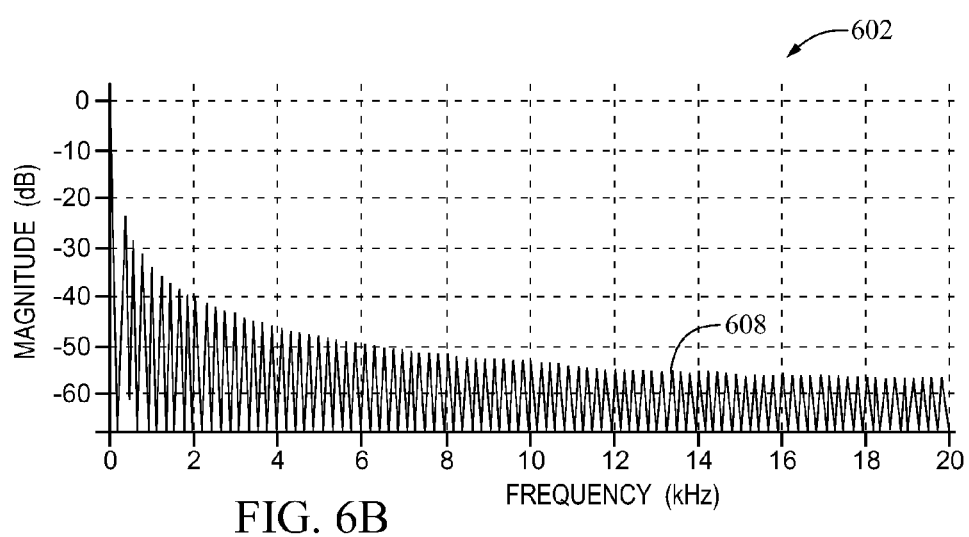
Figure 6C:
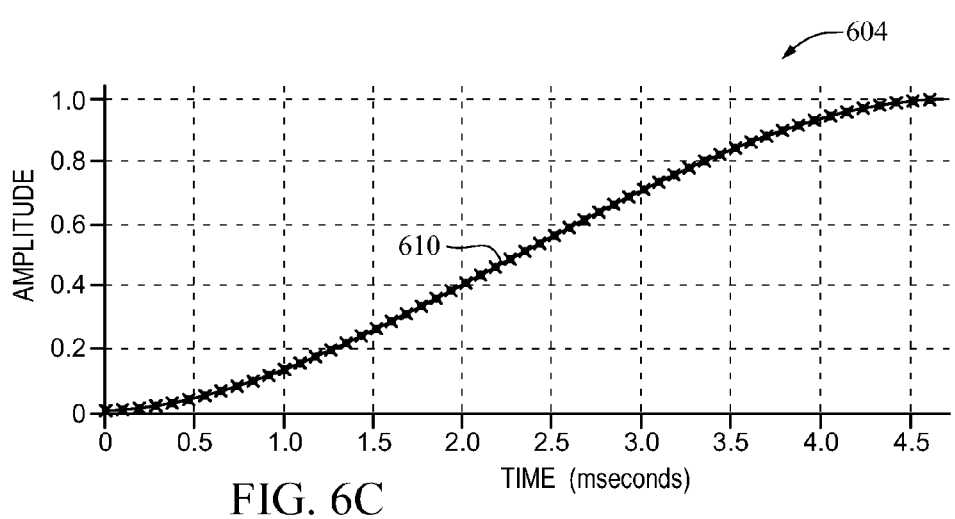

For example, in FIGS. 6A-6C, graphs of various filter responses of the updated filter generated using the one or more cumulative coefficients are shown. Graph 600 of FIG. 6A shows impulse response 606 of the updated filter, and graph 602 of FIG. 6B shows frequency response 608 of the updated filter.

Graph 604 of FIG. 6C shows step response 610 of the updated filter. Each time interval of step response 610 can correspond to a sampling rate of a FIR filter. For example, the cutoff frequency can be 148 Hz (e.g., 6.757 ms) in order to ensure that the motor is not underdamped (e.g., minimize oscillations, ringing, and/or over-shoots of the motor). As shown in step response 610, the preferred settling time associated with the updated filter can be 4.525 ms (e.g., the time period needed for the amplitude of step response 610 to reach unity). For example, at a time of 0 ms, which can correspond to a current position of a motor, the amplitude of step response 610 is zero. As time increases, the amplitude of the step response gradually increases. Then, at a time of 4.525 ms, which can correspond to a next position of the motor, the amplitude of step response 610 reaches 1. Thus, using this updated filter, a focus module (e.g., focus module 110 of FIG. 1 and/or focus module 200 of FIG. 2) can allow the motor to move gradually from a current position to a next position, which can prevent oscillations in the motor movement. For the updated filter with impulse response 606 of FIG. 6A, frequency response 608 of FIG. 6B, and step response 610 of in FIG. 6C, the motor can gradually move from a current position to a next position in 4.525 ms.

Returning to FIG. 3, if the control circuitry determines that a focus module requires a different preferred settling time, the control circuitry can adjust one or more parameters in order to generate a new updated filter. For example, the control circuitry can determine that a longer settling time can be used for the motor. In order to accommodate for the longer settling time, the control circuitry can adjust the sampling period of the set of cumulative coefficients. For example, the control circuitry can program an adjusted sampling period of 6 into a sample_period_coeff register (Table 1) of the memory. In comparison to an updated filter with impulse response 606 of FIG. 6A, frequency response 608 of FIG. 6B, and step response 610 of in FIG. 6C, the control circuitry can increase the sampling period of the set of cumulative coefficients by a factor of 2. As a result of this adjustment, the sampling rate of the FIR filter changes to 20 kHz (e.g., 40 kHz/2). In addition, the cutoff frequency increases by ½ fold and changes to 74 Hz (e.g., 148 Hz/2), and the preferred settling time increases to 9.05 ms (e.g., 4.525 ms*2).

As another example, the control circuitry can determine that a shorter settling time is needed for the motor. In order to accommodate for the shorter settling time, the control circuitry can adjust a step size for reading one or more cumulative coefficients 314 from SRAM 312. For example, the control circuitry can program an adjusted step size (e.g., a step size of 2) into a step_size register of the memory. As a result of this adjustment, the control circuitry can read cumulative coefficients 314 stored in every other entry of SRAM 312 (e.g., the control circuitry can read a smaller number of cumulative coefficients 314). Thus, in comparison to an updated filter with impulse response 606 of FIG. 6A, frequency response 608 of FIG. 6B, and step response 610 of in FIG. 6C, the sampling rate of the FIR filter changes to 80 kHz (e.g., 40 kHz*2). In addition, the cutoff frequency increases by 2 fold and changes to 296 Hz (e.g., 148 Hz*2), and the preferred settling time decreases to 2.26 μs (e.g., 4.525 ms/2). Persons skilled in the art will appreciate that the control circuitry can adjust any suitable parameter(s) to accommodate various preferred settling times. For example, the control circuitry can adjust the sampling period of the set of cumulative coefficients (e.g., by programming a sample_period_coeff register of the memory), the step size for reading one or more cumulative coefficients 314 from SRAM 312 (e.g., by programming a step_size register of the memory), the number of cumulative coefficients to read from SRAM 312 (e.g., by programming a num_coeff register of the memory), and/or the start address of SRAM 312 in which to begin to read one or more cumulative coefficients 314 (e.g., by programming a start_addr register of the memory).

Referring back to FIG. 3, using adjustable filter engine 300, the control circuitry can control which cumulative coefficients to read from SRAM 312 in order to generate an updated filter. The control circuitry can thereby control one or more filter characteristics of the updated filter without making any adjustments to the hardware of a focus module (e.g., focus module 110 of FIG. 1 or focus module 200 of FIG. 2). In addition, for a particular system clock rate, adjustable filter engine 300 can support one or more settling times, one or more updated filters with different sets of cumulative coefficients, and/or one or more adjustable sampling rates. In particular, the one or more updated filters can accommodate a variety of motors with various tolerances for adjusting to new positions requests.

In some embodiments, the control circuitry can use adjustable filter engine 300 to apply an updated filter to a current position of a motor and a next position of the motor. For example, a current position of the motor can be programmed in register 308 and a next position of the motor can be programmed in register 310. As each cumulative coefficient 314 is read from SRAM 312, the control circuitry can multiply cumulative coefficient 314 and the current position programmed in register 308 using multiplier 316 to obtain a weighted current position 318. In addition, using adder 320, the control circuitry can subtract cumulative coefficient 314 from a value of 1 to obtain adjusted cumulative coefficient 322. Then, using multiplier 324, the control circuitry can multiply adjusted cumulative coefficient 322 and the next position programmed in register 310 to obtain a weighted next position 326. Finally, using adder 328, the control circuitry can add the weighted current position 318 and the weighted next position 326 to obtain an output of the updated filter 330.

As a result, despite having a compact hardware design, adjustable filter engine 300 can be used to perform a convolution between the updated filter and one or more signals (e.g., a current position of a motor and a next position of the motor). In contrast to designs that require a large number of hardware logic (e.g., a large number of accumulators) in order to perform the convolution between a FIR filter and the one or more signals, adjustable filter engine 300 can be used to perform the convolution with only two multipliers (e.g., multipliers 316 and 324) and no accumulators. Thus, the bit-width requirements of adjustable filter engine 300 can be reduced from a traditional design.

In addition, by generating an updated filter using one or more cumulative coefficients 314, the control circuitry can provide zero direct current ("DC") drift when the updated filter is applied to one or more signals (e.g., one or more digital codes corresponding to a current position of a motor programmed in register 308 and a next position of the motor programmed in register 310). For example, because each cumulative coefficient 314 ($C_i$) may be applied to a current position programmed in register 308, and each adjusted cumulative coefficient 322 ($1-C_i$) may be applied to a next position programmed in register 310, the sum of the two coefficients is always equal to 1 (e.g., $C_i+(1-C_i)=1$). In contrast, in other FIR systems, quantization may be needed for coefficients stored in finite bit-width registers. As a result, the DC drift in these FIR systems is usually not equal to zero because the large number of accumulators in these systems can accumulate quantization errors during the convolution process (e.g., the coefficients do not sum to 1).

Figure 7:
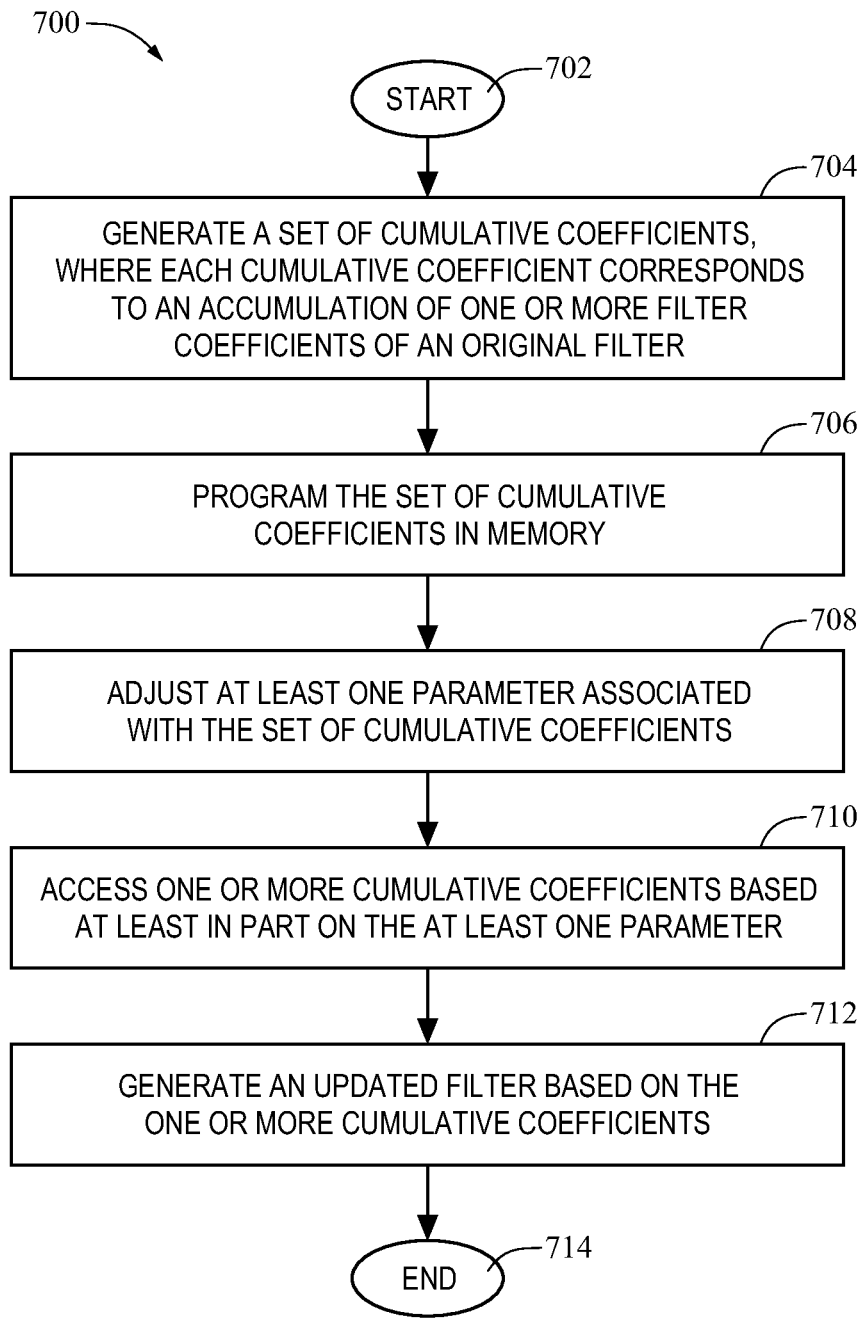
FIG. 7 is a flowchart of an illustrative process for generating an updated filter in accordance with one embodiment of the invention.
Figure 8:
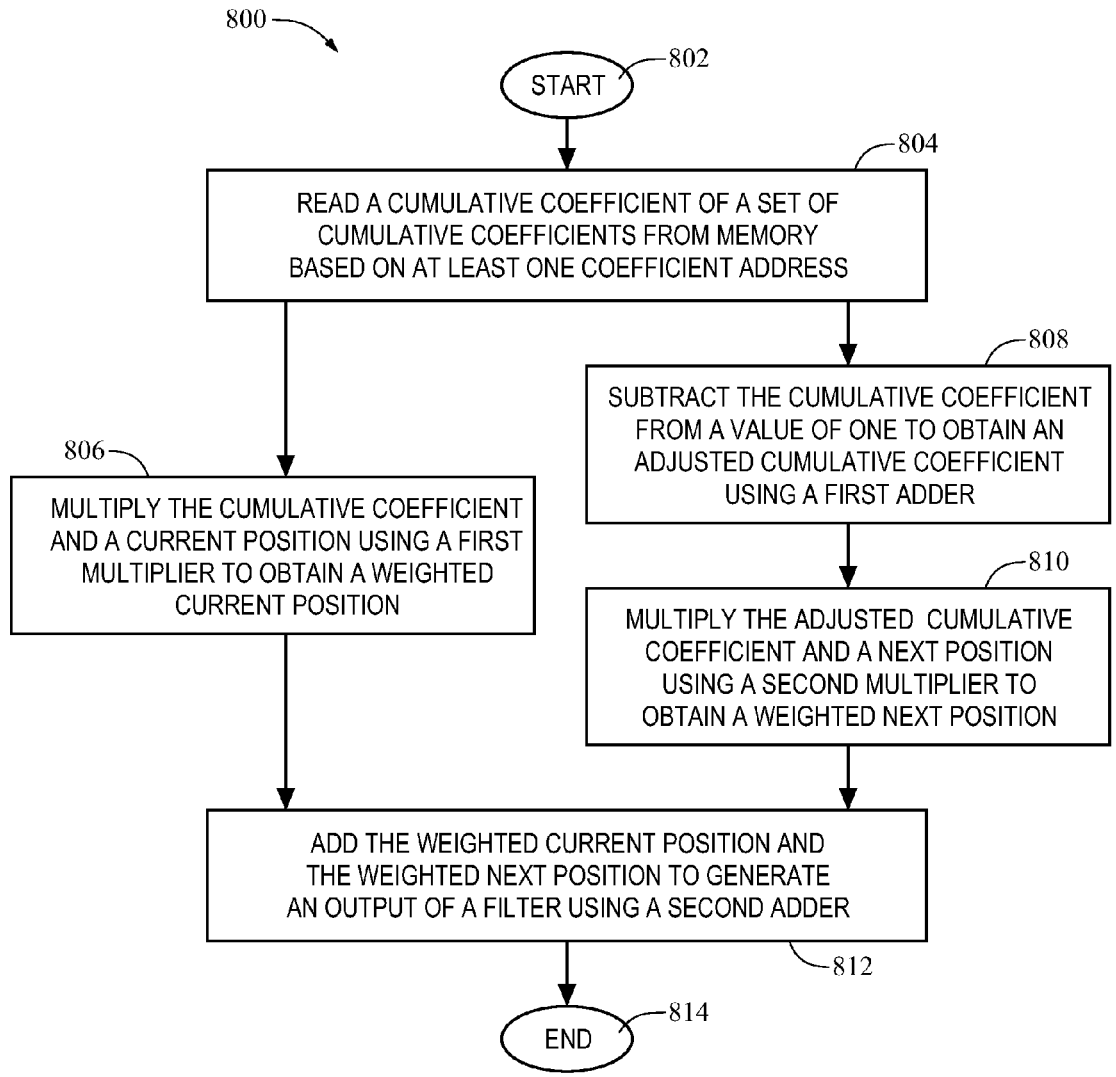
FIG. 8 is a flowchart of an illustrative process for generating an output of a filter in accordance with one embodiment of the invention.

FIGS. 7 and 8 are flowcharts of processes that can be executed by an electronic system (e.g., electronic system 100 of FIG. 1) to generate an updated filter. Process 700 of FIG. 7 and process 800 of FIG. 8 may be executed by control circuitry configured in accordance with embodiments of the invention, such as control circuitry 102 of FIG. 1. It should be understood that processes 700 and 800 are merely illustrative, and that any steps can be removed, modified, combined, or any steps may be added, without departing from the scope of the invention.

Turning first to FIG. 7, a flowchart of illustrative process 700 is shown for generating an updated filter. Process 700 may begin at step 702. At step 704, control circuitry can generate a set of cumulative coefficients, where each cumulative coefficient can correspond to an accumulation of one or more filter coefficients of an original filter. For example, the original filter can correspond to a low-pass FIR filter, which can be represented by a set of filter coefficients (e.g., a set of filter coefficients 402 of FIG. 4). Based on the set of filter coefficients, the control circuitry can generate the set of cumulative coefficients by accumulating one or more of the filter coefficients (e.g., the set of cumulative coefficients can be calculated using equation (3)).

Then, at step 706, the control circuitry can program the set of cumulative coefficients in memory (e.g., memory 108 of FIG. 1, SRAM 312 of FIG. 3, and/or SRAM 500 of FIG. 5). For example, the set of cumulative coefficients can be programmed into one or more entries (e.g., one or more entries 512 of FIG. 5) of a SRAM. In some embodiments, prior to programming the set of cumulative coefficients in memory, the control circuitry can re-arrange the ordering of the set of cumulative coefficients by reversing the ordering of the set of cumulative coefficients to generate a new set of cumulative coefficients (e.g., a set of cumulative coefficients 404 of FIG. 4). The reversed ordering of the set of cumulative coefficients can allow the control circuitry to perform one or more convolutions with a minimal amount of hardware.

In some embodiments, the control circuitry can program one or more parameters into one or more registers of the memory (e.g., registers 302-310 of FIG. 3). The one or more registers can correspond to any suitable register such as, for example, a register for enabling a FIR filer (e.g., an enable register of Table 1), a register corresponding to a start address of a SRAM (e.g., a start_addr register of Table 1), a register corresponding to a total number of cumulative coefficients (e.g., a num_coeff register of Table 1), a register corresponding to a step size for programming the set of cumulative coefficients (e.g., a step_size register of Table 1), and a register corresponding to a sampling period of the set of cumulative coefficients (e.g., a sample_period_coeff register of Table. 1).

Continuing to step 708, the control circuitry can adjust at least one parameter associated with the set of cumulative coefficients. For example, the control circuitry can determine a preferred response (e.g., a step response with a preferred settling time) of the updated filter, which can be used to compensate for oscillations in the motor movement due to a new position request. Upon determining the preferred response, the control circuitry can determine one or more suitable parameters such as, for example, a sampling period of the set of cumulative coefficients, a step size for reading one or more cumulative coefficients from memory, a number of cumulative coefficients to read from the memory, and/or the start address of the memory from which to begin to read one or more cumulative coefficients. After determining the one or more parameters associated with the set of cumulative coefficients, the control circuitry can program the one or more adjusted parameters in memory (e.g., by programming a sample_period_coeff register, a step_size register, a num_coeff register, and/or a start_addr register of the memory).

Then, at step 710, the control circuitry can access one or more cumulative coefficients based at least in part on the at least one parameter. For example, based on the at least one parameter, the control circuitry can read one or more cumulative coefficients from memory (e.g., SRAM 312 of FIG. 3 or SRAM 500 of FIG. 5). In some embodiments, the at least one parameter (e.g., a sampling period of the set of cumulative coefficients) may change the sampling frequency for accessing the one or more cumulative coefficients. In other embodiments, the at least one parameter (e.g., a step size, a number of cumulative coefficients, and/or a start address of the memory) may change which entries of the memory may be accessed by the control circuitry.

Continuing to step 712, the control circuitry can generate an updated filter based on the one or more cumulative coefficients. For example, the updated filter can have filter characteristics that can compensate for oscillations in the motor movement due to a new position request. In some embodiments, the updated filter can be a low-pass filter with filter responses as provided in graphs 600-604 of FIGS. 6A-6C, respectively. Process 700 may then end at step 714.

Turning now to FIG. 8, a flowchart of illustrative process 800 is shown for generating an output of a filter using an adjustable filter engine (e.g., adjustable filter engine 300 of FIG. 3). Process 800 may begin at step 802. At step 804, control circuitry can read a cumulative coefficient (e.g., cumulative coefficient 314 of FIG. 3) of a set of cumulative coefficients from memory (e.g., memory 108 of FIG. 1, SRAM 312 of FIG. 3, and/or SRAM 500 of FIG. 5) based on at least one coefficient address. For example, a coefficient address generator (e.g., coefficient address generator 313 of FIG. 3) of the adjustable filter engine may generate at least one coefficient address using values programmed in one or more registers (e.g., registers 302-306). For instance, the registers may correspond to sample_period_coeff, enable, start_addr, num_coeff, and/or step_size registers (Table. 1). In response to receiving the at least one coefficient address, the control circuitry can read a cumulative coefficient from memory.

The control circuitry may then take any suitable steps (e.g., steps 806 or 808) following step 804 in order to generate an output of a filter corresponding to the cumulative coefficient (e.g., based at least in part on a value of a current position and a value of a next position). In some embodiments, the control circuitry may execute the steps following step 804 in parallel (e.g., execute steps 806 and 808 at the same time) or in sequence (e.g., execute step 808 followed by step 806, or execute step 806 followed by step 808).

In some embodiments, process 800 may move from step 804 to step 806. At step 806, the control circuitry can multiply the cumulative coefficient and a current position (e.g., a current position of a motor programmed in register 308 of FIG. 3) using a first multiplier (e.g., multiplier 316 of FIG. 3) to obtain a weighted current position (e.g., a weighted current position 318 of FIG. 3).

In some embodiments, process 800 may move from step 804 to step 808. At step 808, the control circuitry can subtract the cumulative coefficient from a value of one to obtain an adjusted cumulative coefficient (e.g., adjusted cumulative coefficient 322 of FIG. 3) using a first adder (e.g., adder 320 of FIG. 3). Then, at process 810, the control circuitry can multiply the adjusted cumulative coefficient and a next position (e.g., a next position of a motor programmed in register 310 of FIG. 3) using a second multiplier (e.g., multiplier 324 of FIG. 3) to obtain a weighted next position (e.g., weighted next position 326).

After obtaining the weighted current position and the weighted next position, at step 812, the control circuitry can add the weighted current position and weighted next position to generate an output of a filter (e.g., output of filter 330 of FIG. 3) using a second adder (e.g., adder 328 of FIG. 3). In some embodiments, the output of the filter can correspond to one value of step response 610 of FIG. 6C. Process 800 then may end at step 814.

In conclusion, various embodiments are disclosed for an adjustable filter engine. In some embodiments, an electronic system is provided that can include a focus module, memory, and control circuitry. In some embodiments, the electronic system can have a component change rate that is slower than the sampling frequency and a system clock rate that is significantly higher than the sampling frequency.

The focus module can include an adjustable filter engine and a motor. By using the adjustable filter engine to generate a digital filter with a large number of filter coefficients, the control circuitry can adjust to a variety of system characteristics. Moreover, this flexibility can be achieved with a compact hardware design. For example, by generating a set of cumulative coefficients and re-arranging the order of the cumulative coefficients, the control circuitry can reduce the bit-width requirements of the adjustable filter engine hardware. For instance, the control circuitry can reduce the number of multipliers required to perform a convolution between an updated filter and one or more signals (e.g., a current position of a motor and a next position of the motor).

In some embodiments, the control circuitry can generate an updated filter to reduce oscillations of the motor movement due to a new position request. For example, due to system characteristics such as the particular tolerance of a motor to a new position request or a system clock rate, the control circuitry can determine a response of the updated filter (e.g., a step response with a preferred settling time) that can compensate for oscillations of the motor movement.

In particular, based on the preferred settling time, the control circuitry can adjust one or more parameters that can be used to adjust the response of the updated filter. For example, the parameters can determine a sampling period that can be used for sampling the cumulative coefficients. As another example, the parameters can determine which cumulative coefficients to use for generating the updated filter. In some embodiments, for a particular system clock rate, the adjustable filter engine can be capable of supporting one or more settling times, one or more filters with different numbers of cumulative coefficients, and/or one or more different sampling rates.

The described embodiments of the invention are presented for the purpose of illustration and not of limitation.

What is claimed is:

1. A method of generating an updated filter, the method comprising:

receiving a set of filter coefficients;

generating a set of cumulative coefficients from the set of filter coefficients, each element of which corresponding to an accumulation of one or more coefficients of said set of filter co-efficients;

storing the set of cumulative coefficients in a memory included in an electronic device;

adjusting at least one parameter associated with the set;

accessing one or more cumulative coefficients of the set based at least in part on the at least one parameter; and generating an updated filter based on the one or more cumulative coefficients, by at least one of selectively accessing and rearranging the order of ones of said stored cumulative coefficients.

2. The method of claim 1, wherein the memory is a static random access memory ("SRAM").

3. The method of claim 1, wherein the generating the set of cumulative coefficients is performed according to:

$$C=\{C_i|C_i=\Sigma c_k, i\in\{1,\ldots,N-1\}\}, \text{ for } k=0 \text{ to } i=N-1-i$$

where C is the set of cumulative coefficients, $c_k$ is the set of filter coefficients, and N is the number of coefficients of the original filter.

4. The method of claim 1, wherein the programming further comprises reversing an ordering of the set of cumulative coefficients.

5. The method of claim 1, wherein the programming further comprising programming a number of cumulative coefficients of the set of cumulative coefficients into a register of the memory.

6. The method of claim 1, wherein the adjusting comprises adjusting one or more filter characteristics based on one or more system characteristics.

7. The method of claim 1, wherein the adjusting comprises: determining a preferred settling time of a step response of the adjusted filter; and adjusting a number of cumulative coefficients of the set of cumulative coefficients based at least in part on the preferred settling time.

8. The method of claim 1, wherein the adjusting comprises programming the at least one parameter into a register of an adjustable filter engine.

9. The method of claim 1, wherein the adjusting further comprises: determining a sampling period of the set of cumulative coefficients in the memory based at least in part on a system clock rate and a sampling rate of the original filter; and programming the sampling period into a register of the memory.

10. The method of claim 1, wherein the at least one parameter comprises at least one of a sampling period, a start address, a step size, and a number of cumulative coefficients.

11. A system for generating an updated filter, comprising:
a memory comprising at least one register provided in an electronic device; and
control circuitry, wherein the control circuitry is operative to:
receive a set of filter coefficients;
generate a set of cumulative coefficients from the set of filter coefficients, each element of which corresponding to an accumulation of one or more coefficients of said set of filter coefficients;
store the set of cumulative coefficients in the memory;
adjust at least one parameter associated with the set;
access one or more cumulative coefficients of the set based at least in part on the at least one parameter; and
generate an updated filter based on the one or more cumulative coefficients, by at least one of selectively accessing and rearranging the order of ones of said stored cumulative coefficients.

12. The system of claim 11, wherein the memory is a static random access memory ("SRAM").

13. The system of claim 11, wherein said generate a set of cumulative coefficients is performed according to:

$$C=\{C_i|C_i=\Sigma c_k, i\in\{1,\ldots,N-1\}\}, \text{ for } k=0 \text{ to } i=N-1-i$$

where C is the set of cumulative coefficients, $c_k$ is the set of filter coefficients, and N is the number of coefficients of the original filter.

14. The system of claim 11, wherein said programming further comprises reversing an ordering of the set of cumulative coefficients.

15. The system of claim 11, wherein said programming further comprises programming a number of cumulative coefficients of the set of cumulative coefficients into a register of the memory.

16. The system of claim 11, wherein said adjust at least one parameter comprises adjusting one or more filter characteristics based on one or more system characteristics.

17. The system of claim 11, wherein said adjust at least one parameter comprises: determining a preferred settling time of a step response of the adjusted filter; and
adjusting a number of cumulative coefficients of the set of cumulative coefficients based at least in part on the preferred settling time.

18. The system of claim 11, wherein said adjust at least one parameter comprises programming the at least one parameter into a register of an adjustable filter engine.

19. The system of claim 11, wherein said adjust at least one parameter further comprises:
determining a sampling period of the set of cumulative coefficients in the memory based at least in part on a system clock rate and a sampling rate of the original filter; and
programming the sampling period into a register of the memory.

20. The system of claim 11, wherein the at least one parameter comprises at least one of a sampling period, a start address, a step size, and a number of cumulative coefficients.

21. The system of claim 11, wherein said memory and control circuitry are integrated in a semiconductor chip.

* * * * *